United States Patent [19]

Kadomura et al.

[11] Patent Number: 5,221,430

[45] Date of Patent: Jun. 22, 1993

[54] DRY ETCHING METHOD

[75] Inventors: Shingo Kadomura; Yukihiro Kamide, both of Kanagawa, Japan

[73] Assignee: Sony Corporation, Tokyo, Japan

[21] Appl. No.: 860,074

[22] Filed: Mar. 30, 1992

[30] Foreign Application Priority Data

Mar. 29, 1991 [JP] Japan .................................. 3-091544

[51] Int. Cl.⁵ ............................................ H01L 21/00
[52] U.S. Cl. .................................... 156/665; 156/643; 156/646; 156/652
[58] Field of Search ................ 156/643, 646, 665, 652

[56] References Cited

U.S. PATENT DOCUMENTS

| | | | |
|---|---|---|---|
| 4,030,967 | 6/1977 | Ingrey et al. | 156/665 |
| 4,919,748 | 4/1990 | Bredfenner et al. | 156/643 |

FOREIGN PATENT DOCUMENTS

2-281594  11/1990  Japan .

OTHER PUBLICATIONS

"Reactive Ion Etching of Piezoelectric Films for Acoustic Wave Devices"; Utrosonic Symposia Proceedings, 1, Abstract, 1982; Wang et al.

"Silicon Processing for the VLSI Era"; vol. 1; by Stanley Wolfe; ©1986; Lattice Press; Sunset Beach, Ca., pp. 559–563.

Primary Examiner—Brian E. Hearn
Assistant Examiner—George Goudreau
Attorney, Agent, or Firm—Hill, Van Santen, Steadman & Simpson

[57] ABSTRACT

Proposed is a method for improving resist selectivity in dry etching of an aluminum-based material layer. A mixed gas containing a chlorine-based gas and hydrogen iodide (HI) is used as an etching gas. The chlorine-based gas furnishes Cl* as a main etchant for the Al-based material layer, while HI furnishes H*. For anisotropic etching of the Al-based material layer, decomposition products of a resist mask are used as a sidewall protection film. It has been known that deposition of the sidewall protection film is promoted when hydrogen atoms are contained in the sidewall protection film. HI is used in the present invention as a supply source for H* because the interatomic bond energy of its H—I bond is low as compared to that of $H_2$, HCl or HBr so that HI is superior to the H* yielding efficiency under discharge dissociation conditions. In this manner, the bias power necessary for anisotropic etching may be reduced to inhibit sputtering out of the resist mask. Among practically useful etching gases are $BCl_3/Cl_2$/HI and $Cl_2$/HI.

2 Claims, 1 Drawing Sheet

DRY ETCHING METHOD

BACKGROUND OF THE INVENTION

1. Field of the Invention

This invention relates to a dry etching method employed in the preparation of semiconductor devices. More particularly, it relates to a dry etching method for etching a layer of an aluminum-based material with improved resist selectively.

2. Description of the Related Art

As metallization materials for semiconductor devices, aluminum (Al), an All-Si alloy containing 1 to 2 wt % of Si besides Al and an Al-Si-Cu alloy, further containing 0.5 to 1 wt % of copper (Cu) for combatting stress-migration, are employed extensively.

Dry etching of the layer of the Al-based material is generally performed using chlorine-based gases. Typically of these is a $BCl_3/Cl_2$ mixed gas as disclosed in JP Patent KOKOKU Publication No. 59/22374 (1984). Since the chemical species functioning as a main etchant during etching of the layer of the Al-based material is Cl* (chlorine radicals), it is inherently sufficient to use only $Cl_2$. However, a native oxide is present in usual on the surface of the layer of the Al-based material and, unless this oxide is reduced, etching does not proceed smoothly. On the other hand, etching proceeds only isotropically if only Cl* are used, so that ions need to be present in some form or other to achieve anisotropic etching. $BCl_3$ is added in this consideration. That is, since $BCl_3$ yields $BCl_x$, a chemical species exhibiting a strong reducing action in the plasma, reduces the native oxide film on the surface of the layer of the Al-bases material to cause the etching reaction to proceed smoothly. On the other hand, since ions such as $BCl_x^+$ yielded from $BCl_3$ promotes forward sputtering of a resist mask to cause carbonaceous reaction products, such as $CCl_x$, to be deposited on the pattern sidewall, anisotropic etching is enabled under such sidewall protection effect by the deposits.

However, for achieving anisotropic etching by the above mentioned $BCl_3/Cl_2$ mixed gas, it is presupposed that a moderately high ion incident energy be used to produce forward sputtering of the resist mask, as mentioned previously. For this reason, resist selectivity is essentially low and was heretofore of the order of 2 at most. Recently, in keeping up with the tendency towards higher integration degree of semiconductor devices and more complicated device arrangement, the wafer surface step difference tends to be increased, so that the necessity for significant overetching is correspondingly increased. In this consideration, such low selectivity may prove to be a hindrance in carrying out the process in future.

As a concept for overcoming such low selectivity, it has hitherto been contemplated to intensify sidewall protection effects by the etching reaction products to reduce the ion incident energy required for anisotropic etching to inhibit excess sputtering of the resist mask.

For example, in Digest of Papers, 1990 3rd. Micro Process Conference, B-6-3, a report is made of an example of effecting anisotropic etching of an Al-Si-Cu layer using a $BBr_3/Cl_2$ mixed gas. With this mixed gas, a main etchant for the Al-Si-Cu layer is furnished from $Cl_2$, while Br from $BBr_3$ is combined with carbon atoms contained in the resist material to yield $CBr_x$ which plays the role not only of contributing to achievement of shape anisotropy by being deposited on the pattern sidewall, but of protecting the resist mask from ion sputtering on the resist mask surface to lower the etch-rate. The result is the improvement in anisotropy and resist selectivity.

The present Assignee has also proposed a technique of etching the layer of the Al-based material using a gas containing hydrogen as a component element in a molecule thereof, referred to hereinafter as an H-based gas. If a $BCl_3/Cl_2/HCl$ mixed gas, for example, is used, deposition of a resist decomposition product having the composition of $CCl_xH_y$ is promoted on the pattern sidewall to improve shape anisotropy. Since the deposition is promoted in this manner, the bias power necessary for anisotropic etching is correspondingly reduced for improving resist selectivity. In addition, if the underlying oxide layer is exposed during overetching and sputtered so that oxygen functioning as an etchant for the resist mask is released into the etching system, such oxygen is captured by H-based active species and stabilized as OH, so that resist selectivity may similarly be improved in this manner.

OBJECT AND SUMMARY OF THE INVENTION

As described above, a variety of techniques have been proposed for improving resist selectivity in the etching of the Al-based material to give rise to certain favorable results. However, if sidewall protection effects could be intensified further, resist selectivity may correspondingly be improved with corresponding merits in carrying out the etching process.

It is therefore an object of the present invention to provide a dry etching method for a layer of an Al-based material whereby resist selectivity may be improved further.

To this end, according to the present invention, an etching gas containing at least a chlorine-based gas and hydrogen iodide is used in etching the layer of the Al-based material.

As already clarified by the present Assignee, deposition of resist decomposition products, such as $CCl_xH_y$, may be promoted by addition of the H-based gas. Based on this information, eager researches were conducted, and a concept was arrived at that the success in promoting deposition of the resist decomposition product depends on the manner in which the H-based active species are supplied efficiently from the H-based gas. For improving the discharge dissociation efficiency of the H-based gas in the plasma, it suffices to use such H-based gas having the interatomic bond energy with respect to a hydrogen atom lower than that of the conventional H-based gases.

Hydrogen iodide (HI) employed in the present invention has been selected from this standpoint. The interatomic bond energy of the H—I bond is 71.4 kcal/mole which is lower than 153 kcal/mole of the H—F bond, 103.1 kcal/mole of the H—Cl bond, 87.4 kcal/mole of the H—Br bond, 82.3 kcal/mole of the H—S bond or 104.18 kcal/mole of the H—H bond. This indicates that HI is superior in discharge dissociation efficiency to any of the previously proposed H-based gases, such as HF, HCl, HBr, $H_2S$ or $H_2$, so that it yields larger amounts of H-based active species per mole.

Since chlorine gases are used in the present invention as a gas supplying a main etchant for the layer of the Al-based material, Cl-based active species, such as Cl+ or Cl*, are yielded in the etching reaction system. Besides, the above mentioned H-based active species are also produced. The result is that deposition of resist decomposition products having such compositions as $CCl_xH_y$ or $CCl_xH_yI_z$, is promoted, so that anisotropic etching may be performed satisfactorily even although the bias power is lowered. In this manner, the resist mask is physically removed in a lesser amount to improve resist selectivity.

Meanwhile, since the interatomic bond energy of the B-Br bond is 104 kcal/mole, an energy lesser than the discharge dissociation of $BBr_3$ suffices for discharge dissociation of HI. Therefore, the deposition efficiency for $CCl_xH_y$, $CCl_xH_yI_z$ etc. is again superior to that for $CBr_x$ so that the Al-based material layer may be etched in a manner more excellent in resist selectivity than with the use of $BBr_3/Cl_2$.

Also, since HI is a strong reducing agent, it contributes to removal of the native oxide film present on the Al-based material layer.

The present invention is highly suited to the preparation of semiconductor devices produced on the basis of fine design rule to meet requirements for high performance, high integration degree and high reliability.

BRIEF DESCRIPTION OF THE DRAWINGS

FIG. 1a shows the state of a wafer before etching and FIG. 1b shows the state of the wafer after anisotropic etching of the Al-1%Si layer.

DETAILED DESCRIPTION OF THE INVENTION

The present invention is explained in detail with reference to non-limitative Examples.

EXAMPLE 1

In the present Example, the Al-1%Si layer is etched using a $BCl_3/Cl_2/HI$ mixed gas. This process is explained by referring to FIGS. 1a and 1b.

Figure 1:
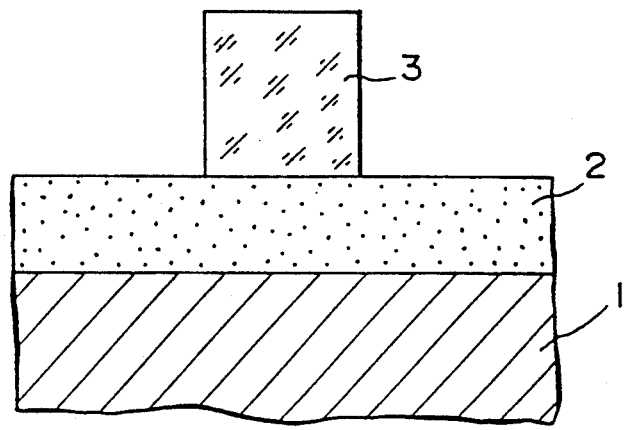
FIGS. 1a and 1b are schematic cross-sectional views showing the dry etching method according to an example of the present invention, step by step, where
Figure 1:
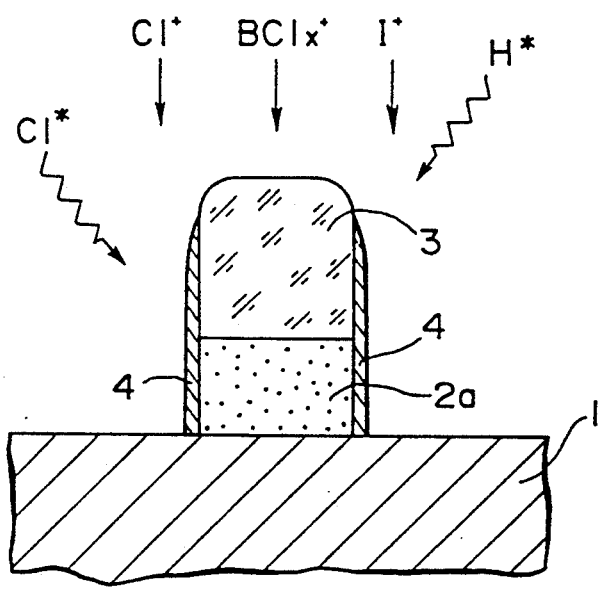

FIG. 1a shows a wafer employed as an etching sample. The wafer includes an interlayer insulating film 1 of silicon oxide or the like, an Al-1%Si layer 2 deposited by sputtering on the interlayer insulating film 1 to a thickness of about 400 nm, and a resist pattern 3 formed on the Al-1%Si layer 2.

The wafer was set on a magnetically enhanced microwave plasma etcher and the Al-1%Si layer 2 was etched under typical operating conditions of a $BCl_3$ flow rate of 60 SCCM, an HI flow rate of 45 SCCM, a gas pressure of 1.3 Pa (10 mTorr), a microwave power of 850 W and an RF bias power of 80 W (2 MHz).

During this process, etching proceeds chemically by $Cl^*$, mainly dissociated from $Cl_2$, as the native oxide film, now shown, formed on the surface of the Al-1%Si layer 2, is reduced by $BCl_3$. At this time, ions generated in the plasma, such as $Cl^+$, $BCl_x^+$ or $I^+$, are incident on the wafer, so that the resist pattern 3 is sputtered to yield reaction products $CCl_x$, $CCl_xI_y$ etc., which are changed at least in part into $CCl_xH_y$ and $CCl_xH_yI_z$ under the action of $H^*$ dissociated from HI. These reaction products are quickly deposited on the pattern sidewall to form a sidewall protection film 4, so that ultimately an Al-1%Si pattern 2a having good shape anisotropy was formed, as shown in FIG. 1b.

The resist selectivity during this process (ratio of the etchrate for the Al-1%Si layer 2 to that for resist pattern 3) is about 5, which is markedly higher than about 2 when the conventional $BCl_3/Cl_2$ etching gas is used. The reason is that the reaction products, such as $CCl_xH_y$ or $CCl_xH_yI_z$, are deposited more efficiently than $CBr_x$ even under low bias conditions whereby a lesser amount of decomposition products of resist pattern 3 are yielded. On the other hand, resist selectivity was not lowered even during overetching.

EXAMPLE 2

In the present Example, the Al-1%Si layer was etched using a $Cl_2/HI$ mixed gas.

The wafer shown in FIG. 1a was set on a magnetically enhanced plasma etcher and the Al-1%Si layer 2 was etched under typical operating conditions of a $Cl_2$ flow rate of 50 SCCM, an HI flow rate of 100 SCCM, a gas pressure of 1.3 Pa (10 mTorr), a microwave power of 850 W and an RF bias power of 80 W (2 MHz).

The composition of the above mixed gas is used with a view to achieving prompt etching, with removal simultaneously of the native oxide film without addition of $BCl_3$, by taking advantage of the fact that HI exhibits strong reducing properties. The etching mechanism in the present Example is similar to that of Example 1, except that contribution by $BCl_x$ is not provided. Resist selectivity was again as high as about 5.

Meanwhile, since it is unnecessary to use $BCl_3$ in the present Example, maintenance of the etcher may be facilitated significantly. It is noted that $BCl_3$ is reacted with residual oxygen in the course of evacuation to yield $B_2O_3$ powders liable to clog the piping to complicate maintenance.

On the other hand, aluminum iodide ($AlI_x$) tends to be deposited on the inner wall of the etching chamber, depending on conditions. However, the deposited $AlI_x$ may be easily vaporized off by heating a site of possible $AlI_x$ deposition to about 100° C. so that there is no risk of pollution by particles.

EXAMPLE 3

In the present Example, the Al-1%Si layer was etched using a $Cl_2/HI$ mixed gas as in Example 2 and a magnetron RIE (reactive ion etching) device.

The wafer shown in FIG. 1a was set on a magnetron RIE device and the Al-1%Si layer 2 was etched under typical operating conditions of a $Cl_2$ flow rate of 50 SCCM, an HI flow rate of 100 SCCM, a gas pressure of 4 Pa (30 mTorr) and an RF bias power density of 3.18 $W/cm^2$ (13.56 MHz).

The etching mechanism in the present Example was substantially the same as that of Example 2, and resist selectivity was as high as about 5.

COMPARATIVE EXAMPLE

As a Comparative example for Example 1, a process of etching an Al-1%Si layer using a $BCl_3/Cl_2/HBr$ mixed gas is explained.

The wafer shown in FIG. 1a was set on a magnetically enhanced plasma etcher and the Al-1%Si layer 2 was etched under typical operating conditions of a $BCl_3$ flow rate of 60 SCCM, a $Cl_2$ flow rate of 45 SCCM, an HBr flow rate of 45 SCCM, a gas pressure of 1.3 Pa (10 mTorr), a microwave power of 850 W and an RF bias power of 80 W (2 MHz).

During this process, the resist pattern was sputtered to yield reaction products, such as $CCl_x$ and $CBr_xCl_y$, at least a part of which was turned into $CCl_xH_y$ and $CBr_xCl_yH_z$. These reaction products were deposited promptly on the pattern sidewall to form a sidewall protection film 4, so that ultimately an Al-1%Si pattern 2a having good shape anisotropy was formed, as shown in FIG. 1b.

The resist selectivity in this process was about 4 which is markedly higher than about 2 obtained when the conventional $BCl_3/Cl_2$ based etching gas was used, but is lower than the value obtained in Example 1. The reason is presumably that, because the interatomic bond energy of the H—Br bond is higher than that of the H—I bond so that the H-yielding efficiency by discharge dissociation of HBr is low as compared to that of HI and hence deposition of $CCl_xH_y$, $CBr_xCl_yH_z$ is suppressed slightly.

Although the present invention has been explained with reference to three Examples, the present invention is not limited to these Examples. For example, rare gases, such as Ar or He, may be suitably added to the etching gases in expectation of sputtering, dilution and cooling effects.

Although the etched layer in each of the above Examples is the Al-1%Si monolayer, the present invention may also be applied to etching of Al-based stacked layers including such as a Ti/TiON base barrier metal layer, or an antireflection film, such as a TiON layer, with similarly favorable results.

What is claimed is:

1. A dry etching method comprising etching an aluminum-based material layer using an etching gas at least containing a chlorine-based gas and hydrogen iodide.

2. A dry etching method as claimed in claim 1 wherein said chlorine-based gas is $Cl_2$ and/or $BCl_3$.

* * * * *